(12) United States Patent  
Nakamura et al.

(10) Patent No.: US 8,169,136 B2  
(45) Date of Patent: May 1, 2012

(54) LIGHT EMITTING DEVICE WITH TRANSLUCENT CERAMIC PLATE

(75) Inventors: Toshitaka Nakamura, Oceanside, CA (US); Hironaka Fujii, Carlsbad, CA (US); Hiroaki Miyagawa, Oceanside, CA (US); Rajesh Mukherjee, Irvine, CA (US); Bin Zhang, Vista, CA (US); Amane Mochizuki, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 329 days.

(21) Appl. No.: 12/389,207

(22) Filed: Feb. 19, 2009

(65) Prior Publication Data

US 2009/0212697 A1 Aug. 27, 2009

Related U.S. Application Data

(60) Provisional application No. 61/030,496, filed on Feb. 21, 2008, provisional application No. 61/153,227, filed on Feb. 17, 2009.

(51) Int. Cl.
*H01J 1/63* (2006.01)
*H01L 33/00* (2010.01)

(52) U.S. Cl. ........ 313/503; 313/512; 313/110; 313/485; 313/486; 257/79; 257/96

(58) Field of Classification Search .................. 313/485, 313/512
See application file for complete search history.

(56) References Cited

U.S. PATENT DOCUMENTS

| | | | |
|---|---|---|---|
| 5,569,547 A * | 10/1996 | Waku et al. | .................... 428/688 |
| 5,587,346 A | 12/1996 | Zuk | |
| 5,627,116 A | 5/1997 | Zuk | |
| 5,998,925 A | 12/1999 | Shimizu et al. | |
| 6,069,440 A | 5/2000 | Shimizu et al. | |
| 6,528,938 B1 * | 3/2003 | Jansma | .......................... 313/485 |
| 7,253,129 B2 | 8/2007 | Takagimi et al. | |
| 7,294,597 B2 | 11/2007 | Kintaka | |
| 7,361,938 B2 | 4/2008 | Mueller et al. | |
| 7,791,093 B2 * | 9/2010 | Basin et al. | ...................... 257/98 |
| 7,799,267 B2 * | 9/2010 | Messing et al. | ............... 264/650 |
| 2003/0227249 A1 | 12/2003 | Mueller et al. | |

(Continued)

FOREIGN PATENT DOCUMENTS

EP 1 588 991 A 10/2005

(Continued)

OTHER PUBLICATIONS

International Written Opinion for PCT/2009/034574, mailed on Apr. 28, 2009.

(Continued)

*Primary Examiner* — Sikha Roy  
(74) *Attorney, Agent, or Firm* — Knobbe, Martens, Olson & Bear, LLP

(57) ABSTRACT

A light emitting device comprising a light emitting component that emits light with a first peak wavelength, and at least one sintered ceramic plate over the light emitting component is described. The at least one sintered ceramic plate is capable of absorbing at least a portion of the light emitted from said light emitting component and emitting light of a second peak wavelength, and has a total light transmittance at the second peak wavelength of greater than about 40%. A method for improving the luminance intensity of a light emitting device comprising providing a light emitting component and positioning at least one translucent sintered ceramic plate described above over the light emitting component is also disclosed.

26 Claims, 9 Drawing Sheets

U.S. PATENT DOCUMENTS

| | | | |
|---|---|---|---|
| 2004/0104672 A1* | 6/2004 | Shiang et al. | 313/506 |
| 2004/0145308 A1* | 7/2004 | Rossner et al. | 313/512 |
| 2005/0269582 A1 | 12/2005 | Mueller et al. | |
| 2006/0022582 A1* | 2/2006 | Radkov | 313/503 |
| 2006/0124951 A1 | 6/2006 | Sakata et al. | |
| 2006/0250069 A1* | 11/2006 | Sakata et al. | 313/485 |
| 2007/0126017 A1* | 6/2007 | Krames et al. | 257/98 |
| 2007/0205711 A1 | 9/2007 | Takashima et al. | |
| 2007/0215890 A1 | 9/2007 | Harbers et al. | |
| 2008/0121911 A1* | 5/2008 | Andrews et al. | 257/98 |
| 2008/0187746 A1 | 8/2008 | De Graaf et al. | |
| 2009/0108507 A1* | 4/2009 | Messing et al. | 264/605 |
| 2011/0210658 A1* | 9/2011 | Pan et al. | 313/112 |

FOREIGN PATENT DOCUMENTS

| | | |
|---|---|---|
| WO | WO 2006/097876 | 9/2006 |
| WO | WO 2007/107896 A1 | 9/2007 |
| WO | WO 2007/107915 A | 9/2007 |
| WO | WO 2007/107917 A | 9/2007 |

OTHER PUBLICATIONS

Kasuya, et al., "Characteristic optical properties of transparent color conversion film prepared from YAG:Ce3+ nanoparticles", Applied Physics Letters, Sep. 14, 2007, vol. 91, No. 11, pp. 111916-111916, XP012099134.

Lu, Jianren et al., Neodymium doped yttrium aluminium garnet (Y3A15O12) nanocrystallineceramics—a new generation of solid state laser and optical materials, Journal of Alloys and Compounds, vol. 341, pp. 220-225, (2002).

Yagi, Hideki et al., "Influence of annealing conditions on the optical properties of chromium-doped ceramic $Y_3Al_5O_{12}$," Optical Materials 29, pp. 392-396, (2006).

Yagi, Hideki et al., Characterizations and laser performances of highly transparent $Nd^{3+}$:$Y_3Al_5O_{12}$ laser ceramics, Optical Materials 29, pp. 1258-1262, (2007).

* cited by examiner

LIGHT EMITTING DEVICE WITH TRANSLUCENT CERAMIC PLATE

CROSS-REFERENCE TO RELATED APPLICATIONS

This application claims priority to U.S. Provisional Application Nos. 61/030,496, filed Feb. 21, 2008, and 61/153,227, filed Feb. 17, 2009, both of which are hereby incorporated by reference in their entireties.

BACKGROUND

1. Field of the Invention

The present invention relates to a light emitting device comprising translucent ceramic plates.

2. Description of the Related Art

Solid state light emitting devices such as light emitting diode (LED), organic light emitting diode (OLED) or sometimes called organic electroluminescent device (OEL), and inorganic electroluminescent device (IEL) have been widely utilized for various application such as flat panel display, indicator for various instrument, signboard, and ornamental illumination, etc. As the emission efficiency of these light emitting devices continues to improve, applications that require much higher luminance intensity, such as automobile headlights and general lighting, may soon become feasible. For these applications, white-LED is one of the promising candidates and have attracted much attention.

Conventional white-LED have been manufactured based on the combination of blue-LED and yellow light-emitting YAG phosphor powder dispersed in plastic encapsulant resin like epoxy and silicone as disclosed in U.S. Pat. No. 5,998,925 and U.S. Pat. No. 6,069,440. Typical device structures are shown in FIGS. 1A and 1B. However, since the particle size of YAG phosphor powder utilized for this system is around 1-10 μm, the YAG powders dispersed in the encapsulant resin medium can cause strong light scattering. As a result, a considerable portion of both the incident light from the blue LED and the yellow emitting light from YAG powders ends up being back scattered and dissipated as a loss of white light emission as shown in FIG. 2.

One response to this problem is to form a monolithic ceramic member of wavelength converting material. However, these ceramic members can also suffer from decreased luminosity due to air voids formed during the formation of the ceramic. These air voids can result in reduced transparency to radiation emitted by the LED and/or increased levels of backscattering. Since the refractive index of the air as compared to the ceramic material is relatively large (on the order of 0.5 to 1.0), minute amounts of these air pockets can cause disproportionately large amount of backscattering.

One response to this problem of increased backscattering was to manipulate the refractive index of the materials used in the luminescent layer. For example, the refractive index of the medium in which the phosphor particles are embedded was increased to more closely match the refractive index of the phosphor particles (US 2003/0227249). De Graaf, et al (WO 2006/097876) describes a composite structure embedded in a matrix that is a ceramic composite structure comprising a polycrystalline ceramic alumina material. Sakata, et al (US 2006/0124951) describes a solidified body comprising two or more matrix phases with respective components being two or more oxides. However increased levels of non-emissive materials can still result in increased levels of scattering centers, and reducing the overall luminosity of the ceramic plate.

Another response to reduce the backscattering was to increase the transparency of the material by reducing the scattering centers, and thus minimize the resultant backscattering. However, a highly transparent ceramic plate without scattering centers still maintains a high differential in the refractive index as compared with the refractive index of the air or the encapsulant resin. This high differential results in an increased critical angle at the air/ceramic interface or at the encapsulant resin/ceramic interface, which results in a higher level of radiation being trapped within the ceramic plate due to total internal reflection. Such high levels of reflected radiation are often seen as an apparent illumination of the lateral edges of the ceramic. Thus while the transparency has been improved, the overall luminosity of the device could actually have been reduced.

Still another effort to reduce the back scattering involves preparing nano-sized YAG phosphor particles with particle sizes far smaller than the wavelength of visible light. For example, as disclosed in R. Kasuya et al., "Characteristic optical properties of transparent color conversion film prepared from YAG:$Ce^{3+}$ nanoparticles," Applied Physics Letters, 91, 111916 (2007), it may be possible to attain scattering free transparent nano-composite for such color-changing medium for white-LED if nano-sized YAG phosphor particles with size of less than around 30 nm are uniformly dispersed into encapsulant resin. However, it is well known that luminance intensity (or internal quantum efficiency) tends to decrease if particle size reaches several tens of nanometers or less. Such small particles have net increased surface area to bulk ratio, which means higher total population of unfavorable surface defect sites compared to the same amount of encapsulated micron-sized YAG phosphor particles. As a result, a white LED light output of a LED with nano-sized YAG phosphor particles actually exhibits lower efficiency than a micron-sized phosphor powder based device. Although the backscattering loss can be minimized in a nano-sized phosphor powder based device, the inferior luminance property can surmount the advantage in reduced backscattering. In addition, it is not easy to prepare transparent or translucent mono-dispersed nano-composite due to nano-sized particles' overwhelming strong tendency to aggregate. Thus far, there is no effective way to enhance the light output from a white-LED by minimizing the backscattering loss without sacrificing luminance efficiency of phosphor powders.

SUMMARY OF THE INVENTION

In order to improve the luminance intensity of white LED devices, one or more translucent sintered ceramic plates may be used in combination with a blue LED to create higher intensity white light. By controlling the transparency of the sintered ceramic plates, the backscattering loss can be minimized without the luminance property being sacrificed.

One embodiment provides a light emitting device comprising a light emitting component that emits light with a first peak wavelength, and at least one sintered ceramic plate over the light emitting component, wherein the at least one sintered ceramic plate comprises a multiphasic material, said multiphasic material comprises about 85% to about 99.99% by volume of an emissive phase and about 15% to about 0.01% by volume of a second phase. The said at least one sintered ceramic plate is capable of absorbing at least a portion of the light emitted from said light emitting component and emitting light of a second peak wavelength, wherein said sintered ceramic plate has a total light transmittance at the second peak wavelength of greater than about 40%.

Another embodiment provides a method for improving the luminance intensity of a light emitting device comprising providing a light emitting component, positioning at least one sintered ceramic plate comprising a multiphasic material over the light emitting component, said multiphasic material comprises about 85% to about 99.99% by volume of an emissive phase and about 15% to about 0.01% by volume of a second phase, wherein the at least one sintered ceramic plate has a transmittance of at least about 40% at the peak transmission wavelength, thereby emitting white light from said light emitting device.

DETAILED DESCRIPTION OF THE PREFERRED EMBODIMENT

An improved white light emitting diode (LED) can be constructed using transparent or translucent sintered ceramic plate that is capable of modulating at least a portion of the light emitted from a base LED. One embodiment provides a light emitting device comprising a light emitting component that emits light with a first peak wavelength and at least one sintered ceramic plate over the light emitting component, wherein the at least one sintered ceramic plate comprises a multiphasic material, said multiphasic material comprises about 85% to about 99.99% by volume of a first phase (i.e., emissive phase) and about 15% to about 0.01% by volume of a second phase. The at least one sintered ceramic plate is capable of absorbing at least a portion of the light emitted from said light emitting component and emitting light with a second peak wavelength, wherein said sintered ceramic plate has a total light transmittance at the second peak wavelength of greater than about 40%.

In some embodiments, the light emitting device may be a white LED (i.e., white light emitting LED) that utilizes a base LED as the light emitting component that emits light with a first peak wavelength that can be at least partially absorbed by the sintered ceramic plate comprising a multiphasic material. In some embodiments, the first peak wavelength falls between about 440 nm and about 470 nm. The sintered ceramic plate then emits light with a second peak wavelength that is different from the peak wavelength emitted by the light emitting component. The portion of the light from the light emitting component that was not absorb by the sintered ceramic plate combines with the light emitted from the sintered ceramic plate to form white light.

Figure 1A:
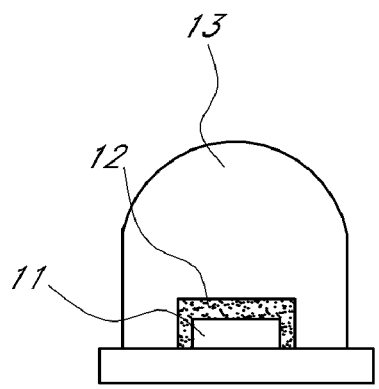
FIGS. 1A and 1B are the cross-sectional view of two conventional white LED device structures.
Figure 1B:
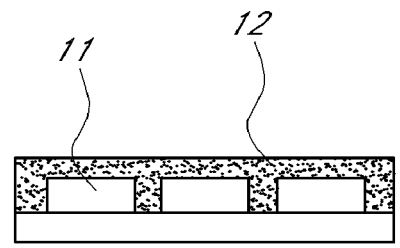
Figure 2:
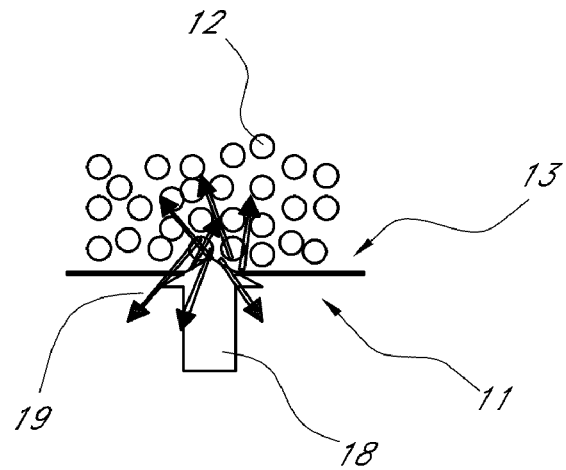
FIG. 2 shows how the light emitted from a blue LED is backscattered by micron-sized yellow phosphor powder in a white LED device.
Figure 3:
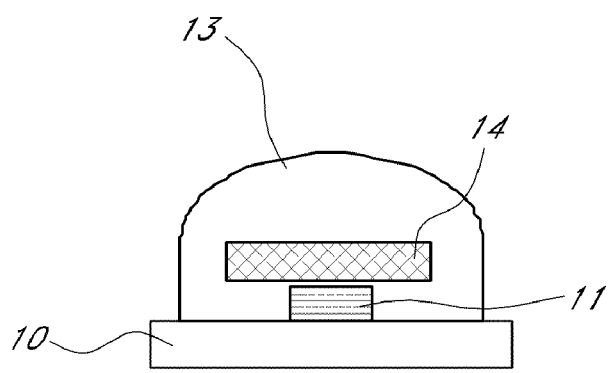
FIG. 3 is the side view of a white LED device with translucent sintered ceramics plate made in accordance with one embodiment of the invention.

With reference to FIG. 3, one embodiment of white LED comprises a conventional base LED 11 mounted on a submount 10, a sintered ceramic plate 14 over the base LED 11, and an encapsulant resin 13 covering the entire device. In some embodiments, the base LED 11 may be a blue LED or a blue-light emitting LED. A portion of the blue light emitted from the blue LED is absorbed by sintered ceramic plate 14 comprising a multiphasic material, and the sintered ceramic plate 14 then emits light with a different wavelength, such as yellow light. Other portion of blue light would be emitted by the blue LED without being absorbed by the sintered ceramic plate 14. Consequently, both blue light and yellow light are emitted from the LED, and the human eye perceives that synthesized or mixed light as white light. The blue LED is typically formed by using AlInGaN based single crystal semiconductor material and is electrically connected when mounted on the submount 10. The blue LED 11 is capable of emitting blue light with a peak wavelength of about 440 nm to about 470 nm. In some embodiments, the base LED 11 may also be UV LED 30 that emits a light with a peak wavelength of about 350 nm to about 410 nm. In some embodiments, translucent sintered ceramic plate 14 of phosphor material, which is capable of absorbing blue light from the blue LED 11 and emitting yellow light, is placed over the blue LED 11. The size of the sintered ceramic plate 14 may match the size of the blue LED 11 or may be larger than the size of the blue LED 11. In some embodiments, the white color balance may be controlled by changing the coverage ratio of the ceramic plate (i.e., color changing medium) over the size of blue LED 11. In some embodiments, the size of sintered ceramic plate 14 may be smaller than the size of blue LED 11.

The sintered ceramics plate 14 may be placed and/or fixed over the blue LED 11 using encapsulant resin 13, specific adhesive, or a mechanical holder. The encapsulant resin 13 and adhesive may include any of silicone, epoxy, low-melting-point-glass, transparent adhesives, or other materials. In embodiments where UV LED 30 is used instead of blue LED 11, epoxy or other material that has light absorption in the wavelength region of UV light emitted from the LED can be degraded. In addition, if the LED is driven at very high operating condition like powder LED, the close proximity of the LED surface can become hot and the adhesive can also be degraded. Therefore, thermally and UV-durable material like silicone and low-melting-point glass may be preferably utilized.

In some embodiments, the white color balance can also be controlled by the thickness of the sintered ceramic plate 14. If the sintered ceramic plate 14 is thinner, the emitted light tends to be bluish. Conversely, if the sintered ceramic plate 14 is thicker, the emitted light color tends to be yellowish. In some embodiments, the thickness of the sintered ceramic plate 14 is usually between about 20 µm to about 500 µm, about 30 µm to about 300 µm or =about 50 µm to about 200 µm. Although the preferred thickness of the sintered ceramic plate 14 for white color light emission depends on the doping amount of rare earth metal as an activator and the degree of scattering of ceramic plate 14.

In some embodiments, the total light transmittance of the sintered ceramic plate 14 at the peak wavelength of emission, or the peak wavelength of the photoluminescent spectrum of the phosphor material, is at least greater than about 40% of the theoretical total light transmittance, preferably greater than about 60% of the theoretical total light transmittance, more preferably greater than about 90% of the theoretical total light transmittance. The amount of theoretical total light transmittance depends on the refractive index of ceramic material. Assuming ceramic material with no scattering centre and having a refractive index of ns, surface reflectance (R) and transmittance (T) between the air (n=1) and the ceramic material can be calculated using the following equations:

$$R = \left(\frac{ns-1}{ns+1}\right)^2 \quad T = 1 - R$$

Considering both upper and bottom surface reflection, theoretical total light transmittance can be calculated using the following equation:

$$\text{Theoretical total light transmittance} = \left(\frac{1}{T} + \frac{1}{T} - 1\right)^{-1}$$

Figure 4:
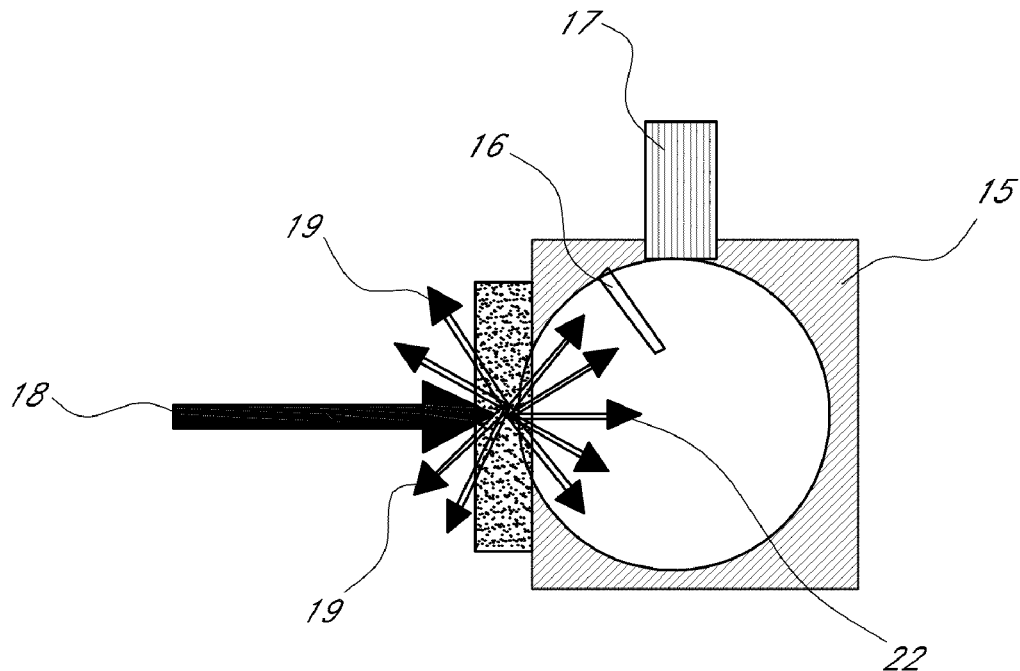
FIG. 4 shows a schematic of one embodiment of a device for measuring the total light transmittance through the sintered ceramic plate.

Using these methods, for example, the theoretical total light transmittance for a YAG:Ce (n=1.83) ceramic plate is around 84.16% of the initial applied radiation emitted from the light emitting component or radiation source. FIG. 4 shows a schematic of one embodiment of a device for measuring the total light transmittance through the sintered ceramic plate 14. An integrating sphere 15 is used to collect all transmitted light 22, including scattered light. The back-scattered light 19 is not transmitted into the integrating sphere and thus is undetectable by the detector 17. If the sintered ceramic plate 14 contains a lot of air voids or defects, total light transmittance tends to be low. Air voids are particularly difficult to combat since the large difference in the refractive indices (the air as compared to the emissive material) makes it difficult to control. However, if the color-changing medium is sintered finely, which results in adequately larger crystalline size of grain and free of air void and defect, the total light transmittance tends to be higher. In some embodiments, the ceramic plate may have an average grain size of between about 100 nm and about 100 µm. In other embodiments, the ceramic plate may have an average grain size between about 1 µm and about 50 µm, or about 5 µm and about 30 µm. In some embodiments, the sintered ceramic plate may have a porosity of less than about 0.1% of the theoretical maximum density. In other embodiments, the ceramic plate may have a porosity of less than about 0.01% of the theoretical maximum density. The theoretical maximum density of the sintered ceramic plate is the density of such plate free of any air void.

Furthermore, if the wavelength of an incident light 18 overlaps with the absorption region of the phosphor materials used to make the sintered ceramic plate 14, the transmittance will not be measured because the incident light is mostly dissipated by phosphor absorption. Therefore, total light transmittance measurements are performed at wavelengths of phosphor emission region, especially around the peak wavelength of photoluminescent spectrum of the phosphor material. In some embodiments, the total light transmittance is not necessarily high if the phosphor does not have light emission at the wavelength region such as near infrared wavelength region.

The types of phosphors for the emissive phase of the sintered ceramic plate 14 are chosen to achieve the desired white point (i.e., color temperature) by taking the absorption and emission spectra of different types of phosphor into consideration. In some embodiments, the translucent sintered ceramic plate comprises a garnet. The garnet may have a composition $A_3B_5O_{12}$, wherein A and B are independently selected from trivalent metals. In some embodiments, A can be selected from the following elements: Y, Gd, La, and Tb; B can be selected from the following elements: Al, Ga, and In. In some embodiments, the garnet is doped with at least one rare earth metal. In some embodiments, the rare earth metal is selected from the group consisting of Ce, Gd, La, Tb, Pr and Eu. Examples of useful phosphors include $Y_3Al_5O_{12}$:Ce, $(Y,Tb)_3Al_5O_{12}$:Ce, $(Y,Gd)_3(Al,Ga)_5O_{12}$:Ce, $(Sr,Ca,Ba)_2SiO_4$:Eu, $Ca_3Sc_2Si_3O_{12}$:Ce, $Ba_3MgSi_2O_8$:Eu, $BaMgAl_{10}O_{17}$:Eu, $La_2O_2S$:Eu, $SrGa_2S_4$:Eu, $CaAlSiN_3$:Eu, $Ca_2Si_5N_8$:Eu, and CaSiAlON:Eu. In one embodiment, the phosphor material comprises $Y_3Al_5O_{12}$:Ce$^{3+}$.

As the air void is reduced, the ceramic is more transparent and allows more primary radiation to pass through. However, the amount of primary radiation trapped by total internal reflection can also be increased, reducing the total amount of light actually emitted by the ceramic plate. Luminescent ceramic layers generally have high refractive indices, for example around 1.83 for $Y_2Al_5O_{12}$:Ce$^{3+}$ ceramic phosphor. The difference between the refractive index of the ceramic layer and the air or the encapsulant resin would be large enough to result in high total internal reflection. In some embodiments, the total internal reflection at ceramic phosphor/air or ceramic phosphor/encapsulant resin interfaces can be reduced by introducing a second phase material into the sintered ceramic plate. In some embodiments, the sintered ceramic plate comprises a multiphasic material comprising an emissive phase and a second phase. In some embodiments, the emissive phase comprises at least one phosphor material, and the second phase comprises at least one metal oxide corresponding to the phosphor material in the emissive phase. Examples of phosphor material are as listed above. Examples of second phase material include, but not limited to, $Al_2O_3$, $Y_2O_3$, CaO, $TiO_2$, MgO, $La_2O_3$, $CeO_2$, $Nd_2O_3$, $Tb_4O_7$, $Eu_2O_3$, BaO, $Gd_2O_3$, and the like. In some embodiments, the emissive phase may comprise $Y_3Al_5O_{12}$ doped with a rare earth metal (for example, $Y_3Al_5O_{12}$:Ce) while the second phase comprises at least one of the following materials: $Y_2O_3$, $Al_2O_3$, $YAlO_3$ (Yttrium Aluminum Perovskite or YAP) and $Y_4Al_{12}O_9$ (Yttrium Aluminum Monoclinic or YAM).

In some embodiments, the volume of the emissive phase is between about 85% to about 99.99% of the total volume of the multiphasic material. In some embodiments, the volume of the second phase is between about 15% and about 0.01% of the volume of the multiphasic material. In some embodiments, the volume % of the emissive phase is between about 90% and about 99.99%, about 95% and about 99%, or about 98% and about 99%; and the volume % of the second phase is between about 10% and about 0.01%, about 7% and about 0.01%, about 5% and about 0.01%, about 3% and about 0.01%, about 2% and about 0.01%, or about 1% and about 0.01%.

In some embodiments, the composite comprising multiphasic material is particularly effective in balancing the high transparency and limited backscattering when the volume ratio of the first phase to the second phase is predominantly heavy in the emissive phase, for example, about 85% emissive phase and about 15% second phase, about 90% emissive phase and about 10% second phase, about 95% emissive phase and about 5% second phase, about 98% emissive phase and about 2% second phase and about 99% emissive phase and about 1% second phase.

Figure 5:
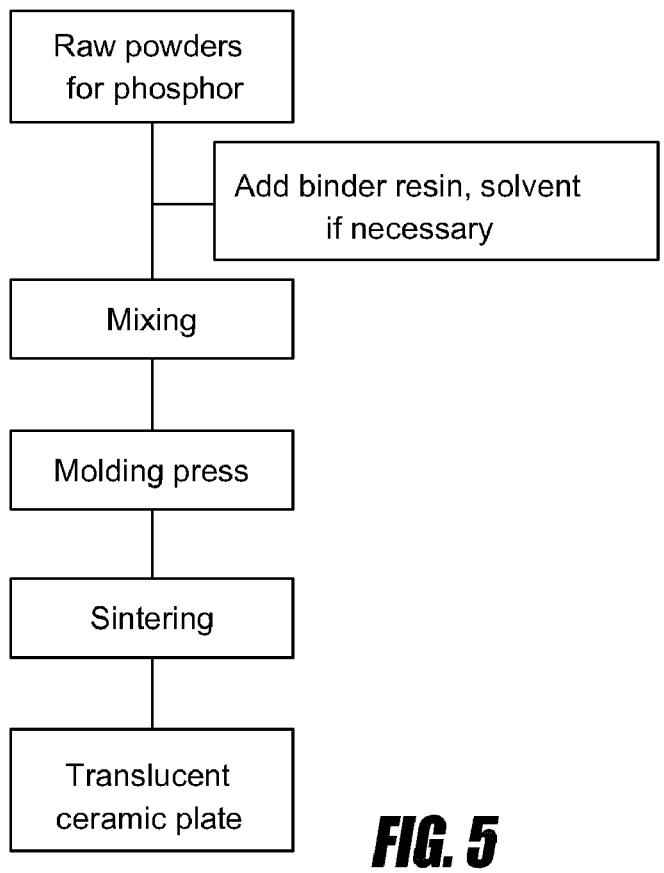
FIG. 5 shows preparation flow diagram for one embodiment of the translucent sintered ceramic plate.

FIG. 5 shows preparation flow diagram for one embodiment of the translucent sintered ceramic plate 14. First, raw powders for phosphor are provided. In some embodiments, raw powders of phosphor materials used to make the sintered ceramic plate 14 are typically nano-sized particles with average particle size no greater than about 1000 nm, preferably no greater than about 500 nm, more preferably no greater than 200 nm. If the particle size is greater than about 1000 nm, it become very difficult to make total light transmittance higher than about 50%, because such large particles do not easily fuse with each other even at a high temperature and high pressure sintering condition. The result would be a tendency for a lot of air voids to remain in the ceramic plate. On the other hand, nano-sized particles can easily fuse with each other, which enable us to prepare fine and air void free ceramic plates.

The nano-powders may be prepared using any conventional or suitable methods, including but not limiting to both wet chemical route and gas phase pyrolysis route. A method of producing nanoparticles using RF induction plasma torch is disclosed in related applications titled "Method of Producing Nanoparticles Using Atomized Droplet" and "Rapid Thermal Heat Treatment Method for Nano-Sized Phosphor Material Production," herein incorporated by reference in their entireties.

The raw materials do not have to have the same composition or crystal structure of resultant phosphor ceramic plate. In one embodiment, YAG:Ce ceramic plate may be made by using YAG:Ce powders, Y—Al—O—Ce containing amorphous powders, a mixture of YAlO$_3$:Ce and Al$_2$O$_3$ powders, a mixture of Y$_2$O$_3$, Al$_2$O$_3$, and CeO$_2$ powders, and any combination thereof.

In some embodiments, small quantity of flux materials (e.g., sintering aids) such as SiO$_2$, MgO and tetraethyl orthosilicate (TEOS) may be used in order to improve sintering property if desired. Additional examples of flux materials include, but are not limited to, alkali metal halides such as NaCl or KCl, and organic compounds such as urea. In some embodiments, the sintered ceramic plate comprises between about 0.01% and about 5%, between about 0.05% and about 5%, between about 0.1% and about 4%, or between about 0.3% and about 1% by weight of the flux material(s) or sintering aid(s). The sintering aid in the sintered ceramic plate can be provided by directly adding the specific sintering aid in the raw materials used to create the ceramic plate, or by utilizing sufficient precursor materials that include the desired sintering aid. For example, in some embodiments, tetraethyl orthosilicate (TEOS) can be added to the precursor solution to provide the desired amount of sintering aid. In one embodiment, about 0.05 wt % to about 5 wt % of TEOS is provided to the sintered ceramic plate. In another embodiment, the amount of TEOS may be between about 0.3 wt % and about 1 wt %

In some embodiments, the mixing and molding process may be made easier by occasionally adding binder resin and solvent to the raw powders. A binder is any substance that improves adhesion of the particles of the composition being heated to form a ceramic solid. Some non-limiting examples of binders include polyvinyl alcohol, polyvinyl acetate, polyvinyl chloride, polyvinyl butyral, polystyrene, polyethylene glycol, polyvinylpyrrolidones, polyvinyl acetates, and polyvinyl butyrates, etc. In some, but not all, circumstances, it may be useful for the binder to be sufficiently volatile that it can be completely removed or eliminated from the precursor mixture during the sintering phase. The mixing process can be done using mortar and pestle, ball milling machine, bead milling machine or other equivalent equipments. For molding process, simple die for tablet molding, hot isostatic pressing (HIP), or cold isostatic pressing (CIP) may be utilized. In one embodiment, controlled quantities of raw powders are loaded in a mold followed by applying pressure to form the plate.

Subsequently, obtained plate is sintered at a high temperature that does not exceed the melting point of the resultant phosphor material. In some embodiments, sintering may be carried out while applying pressure. Sintering conditions such as temperature profile, atmosphere, pressure, and duration depend on the type of phosphor material. Any kinds of suitable ceramic sintering techniques can be used to prepare translucent ceramic plate. It should be noted that it is principally unfeasible to prepare translucent sintered ceramic plate if the crystal structure of phosphor material has an anisotropic aspect. Since the sintered ceramic is not single crystal but conglomerate of crystal grains that are randomly oriented, refractive indices slightly vary depending on the crystalline direction and generates light scattering nature. In some embodiments, transparent single crystal plate may also be utilized instead of the sintered ceramic plate.

The ceramic plate comprising a multiphase material can be made using generally the same methods for making translucent sintered ceramic plates. In some embodiments, the material(s) for forming the second phase can be introduced by adjusting the ratio of the components of the precursor solution. For example, by increasing the amount of aluminum nitrate nonahydrate in the precursor solution, the nano-powder produced by inductively coupled RF thermal plasma pyrolysis followed by annealing would comprise YAG and Al$_2$O$_3$. In some embodiments, adjusting the ratio of yttrium and aluminum precursors can yield nano-powders comprising YAG and one or more of the following materials: YAP, YAM, Y$_2$O$_3$, or Al$_2$O$_3$.

Other conventional methods involving wet chemical routes or gas phase pyrolysis routes can be used to make such mixed nano-powders suitable for making ceramic plate comprising a multiphase material. In other embodiments, second phase material(s) may be introduced and mixed into the phosphor nano-powders prior to the sintering step. In some embodiments, precursor powders made by any method, including those that are commercially available, can be mixed in desired stoichiometric amounts prior to the sintering step. For example, when making a ceramic plate with Y$_3$Al$_5$O$_{12}$:Ce$^{3+}$ as the emissive phase, Y$_2$O$_3$, Al$_2$O$_3$ and CeO$_2$ powders can be mixed together in a stoichiometric amounts for forming the YAG:Ce phase, and a desired additional amount of Y$_2$O$_3$ or Al$_2$O$_3$ powders can be added to form the second phase prior to sintering.

In some embodiments, any kinds of color combinations of the base LED and phosphor materials may be used. In some embodiments, two or more sintered ceramic plates of different phosphors having different emission peak wavelength can be stacked together over the blue LED 11 or the UV LED 30.

Figure 6:
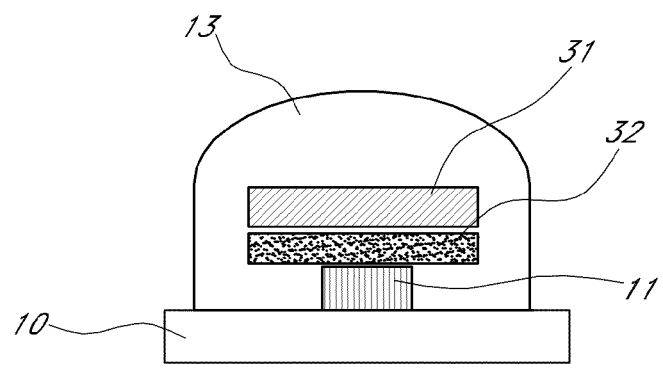
FIG. 6 shows one embodiment of the white LED.
Figure 7:
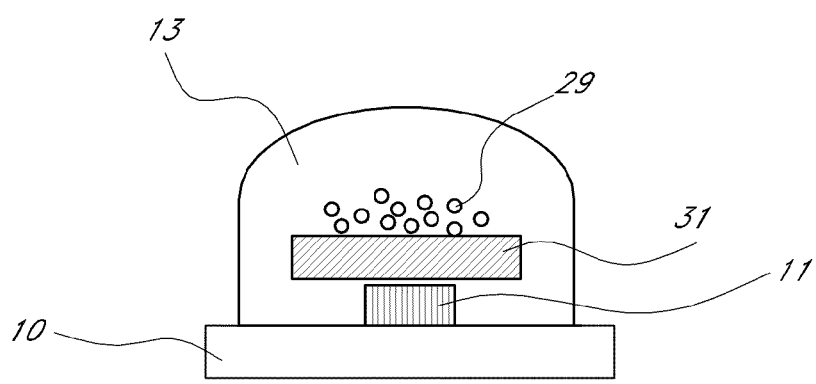
FIG. 7 shows another embodiment of the white LED.
Figure 8:
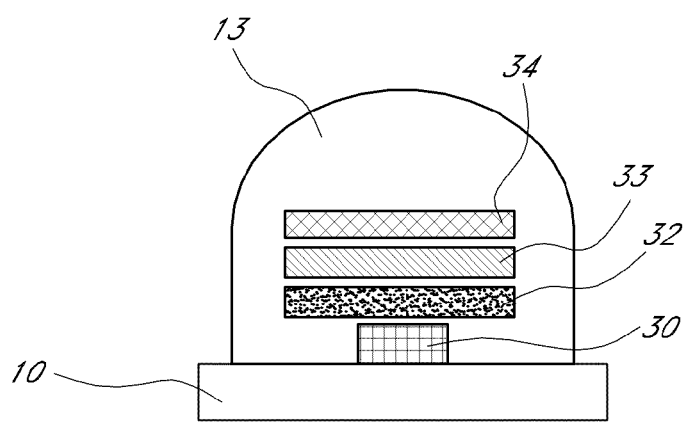
FIG. 8 shows one embodiment of the white LED.

FIG. 6 shows the combination of blue LED 11 with stacked yellow and red emitting phosphor ceramic plates, 31 and 32, over the blue LED 11 to improve color reproducibility. In other embodiments, green and red emitting phosphor ceramic plate combination may also be used. In another embodiment as shown in FIG. 7, the combination of ceramic plate(s) and conventional phosphor powder dispersed in encapsulant resin can also be applied. In one embodiment, red phosphor powders 29 or microcrystals can be dispersed in yellow phosphor ceramics plate 31. In some embodiments, the combination of UV LED 30 with red, green, and blue phosphor ceramic plates, 32, 33 and 34, or powder system may be utilized as shown in FIG. 8.

This invention is not limited to making white-LED. For example, blue, light blue, green, yellow, orange, and red LEDs may also be made based on blue or UV LED.

Although the shape of a ceramic plate is usually like a flat surface plate, any kinds of shape or placing position such as dome shape, different thickness, capped or container shape may be utilized depend on the optical design.

In some embodiments, if the refractive index of the ceramic plate is greater than that of the encapsulant resin, a portion of the emitted light from the phosphor may be confined within the ceramics plate due to total internal reflection, especially as total light transmittance of the ceramics plate becomes higher. In some embodiments, the surface of the ceramic plate can be roughened or randomized, such as forming microlens array, to extract the confined light.

Figure 9:
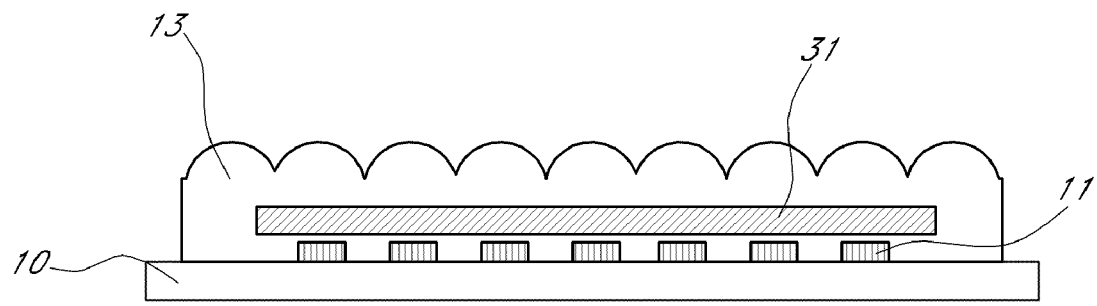
FIGS. 9 and 10 are the side views of two white LEDs prepared in accordance with the embodiments of this disclosure.
Figure 10:
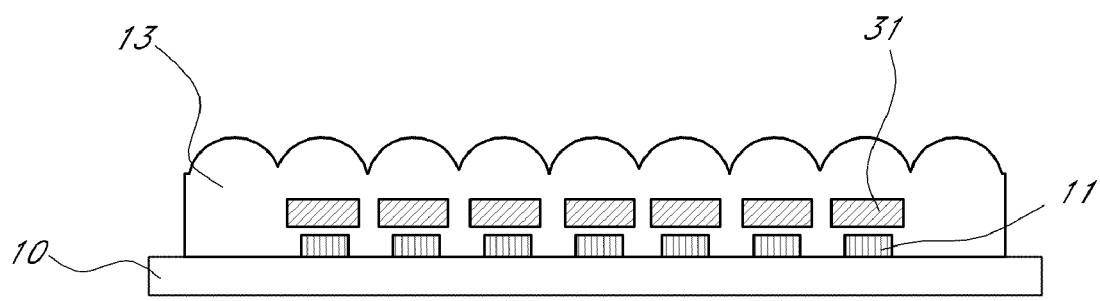
Figure 11:
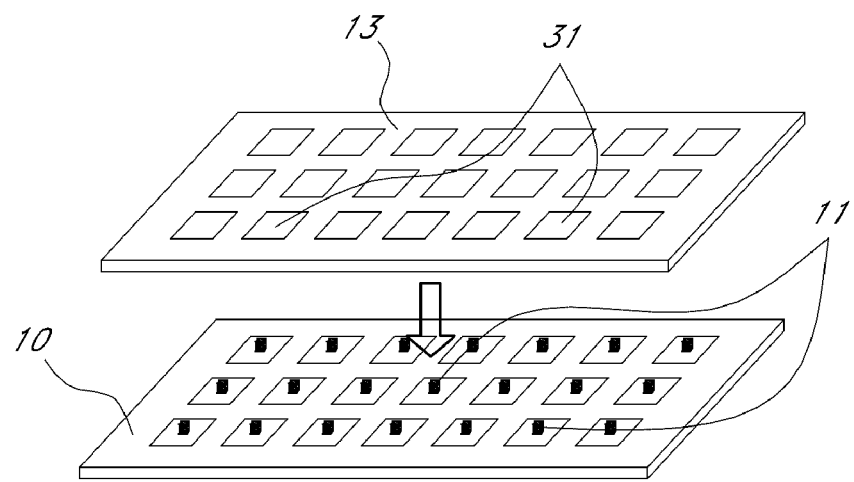
FIG. 11 shows one embodiment of the optical device with an array of base LEDs.

FIGS. 9 and 10 are the side views of two white LED prepared in accordance with the embodiments of this disclosure. FIG. 11 shows an optical device with an array of base LEDs 11 with separate sintered ceramic plate 14 over each base LEDs 11. More than one base LEDs can be mounted on a submount 10 to form an array of base LEDs 11, and at least one translucent sintered ceramic plate 14 of yellow phosphor can be positioned over the array of base LEDs 11. As shown in FIG. 9, one sintered ceramic plate 14 was utilized to cover all the base LEDs 11. As shown in FIGS. 10 and 11, separate sintered ceramic plates 14 can also be positioned over each base LEDs 11 in the array. In some embodiments, long strips of sintered ceramic plate 14 can also be position over a row or a column of base LEDs 11. The entire device parts are encapsulated in the encapsulant resin 13.

Figure 12:
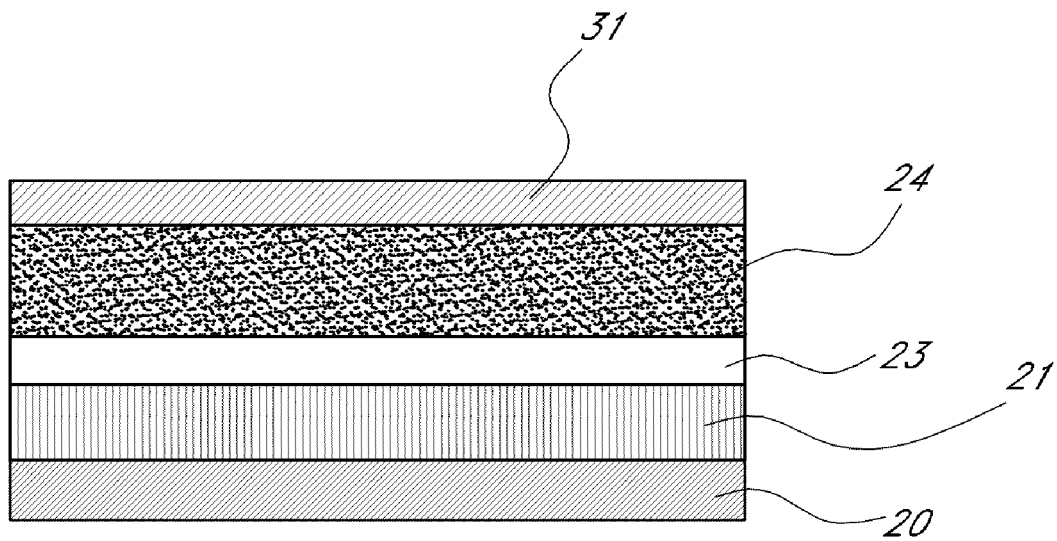
FIGS. 12-14 are the cross-sectional views of three white LED structures made in accordance with the disclosed embodiments.
Figure 13:
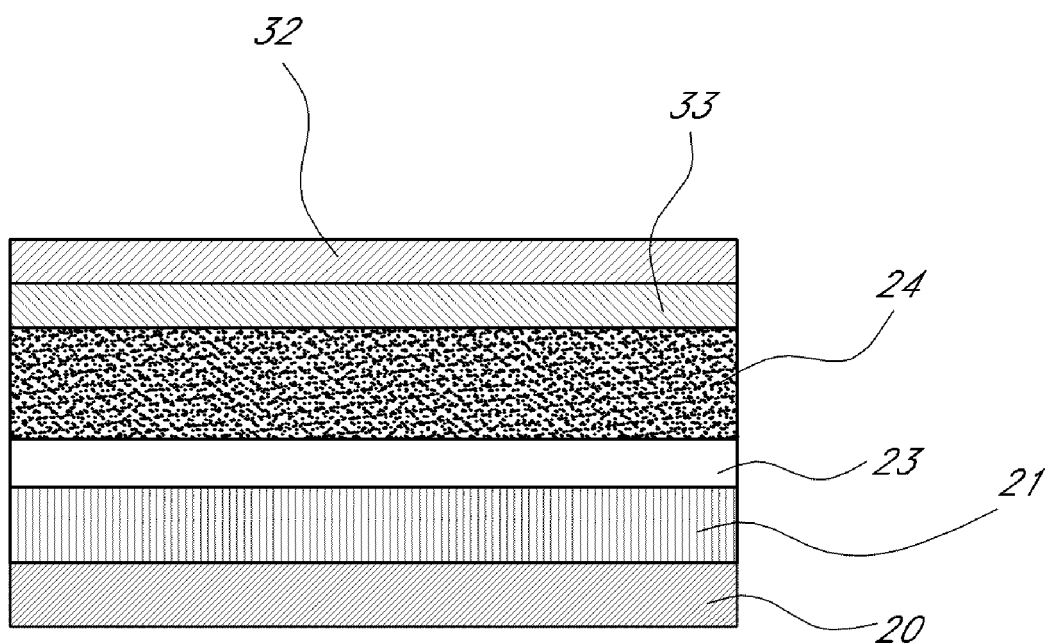
Figure 14:
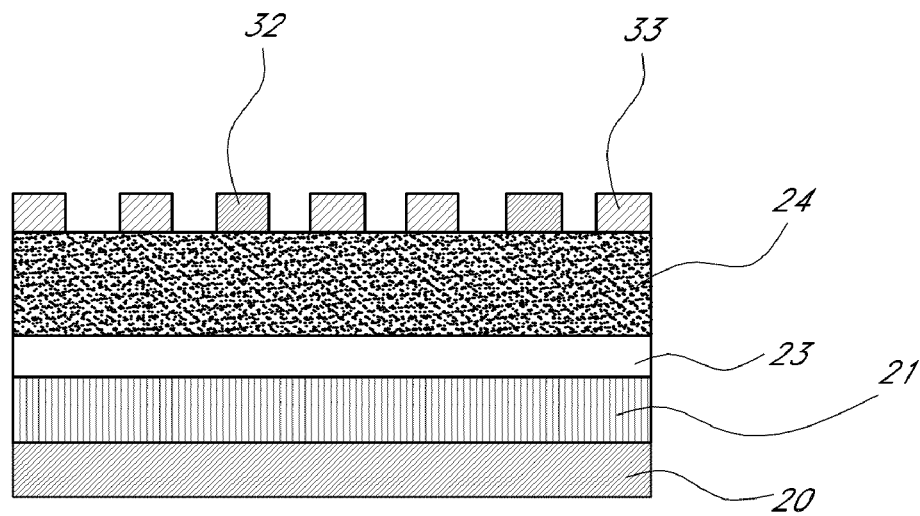

FIGS. 12-14 are the cross-sectional views of three white LED structures made in accordance with the disclosed embodiments. The white LED structure may comprise a metallic cathode 20 with a light emissive layer 21 over the metallic cathode 20. The metallic cathode 20 provides the necessary means for electrically connecting the emissive layer 21. The emissive layer 21 may be organic or inorganic blue emissive layer. A transparent anode 23 is deposited over the emissive layer 21, and a glass substrate 24 is then deposited over the transparent anode 23 for supporting translucent sintered ceramic plate(s). In FIG. 13, two different ceramic plates, red phosphor ceramic plate 32 and green phosphor ceramic plate 33, are positioned over the glass substrate 24 for absorbing emitted light from the blue emissive layer 21 and emitting light having different wavelengths. In FIG. 14, smaller or individual ceramic plates of different phosphors (e.g., red phosphor and green phosphor) were position over the glass substrate 24 to modulate the emitted blue light from emissive layer 21.

Although devices incorporating LEDs have been described and used as examples, these LEDs represent only some of the embodiments. Other suitable optical devices for incorporating sintered ceramic plates include, but not limited to, OLED and IEL.

The embodiments are capable of providing less backscattering loss while maintaining or even increasing the luminance efficiency of the phosphor layer by employing translucent sintered ceramics plate of phosphor material instead of conventional phosphor powder/resin system as a color changing medium. In one embodiment, reducing the air voids and thus increasing transparency in combination with a reduced or limited amount of backscattering effected by utilization of a second phase material enables a finer tuning of the sintered ceramic plate property, thus reducing the effect of total internal reflection and increasing the overall luminance intensity. As a result, white-light emission efficiency of light emitting device, particularly LED, can be further improved compared to conventional phosphor powder/resin composite system. Since ceramic plate is quite stable against heat and light irradiation (even UV light), temperature fluctuation of operational property, durability, and lifetime of the LED can be improved. Furthermore, since it is not so difficult to prepare extremely flat surface of the ceramic plate and make the thickness uniform, reproducibility of white color balance among products can be significantly improved while conventional powder/resin system has considerable white color fluctuation originated from such as inhomogeneous phosphor powder dispersion in the resin, sedimentation of phosphor powder due to larger density, and thickness variation of color changing media in itself.

Some embodiments provide a method for improving the luminance intensity of a LED. In some embodiments, at least one translucent sintered ceramic plate is positioned over a light emitting component, such as a blue LED or a UV LED, to provide a white light emission from the LED. The translucent sintered ceramic plate comprises at least one phosphor material, and may have a transmittance of at least about 40% at the peak transmission wavelength. In some embodiments, the transmittance of the sintered ceramic plate may be at least about 60%, preferably at least about 80% and more preferably at least about 90%. The at least one sintered ceramic plate may be prepared by using nano-sized raw ceramic powders having an average particle size of less than about 1000 nm, preferably no greater than about 500 nm, more preferably no greater than about 200 nm. In some embodiments, the sintered ceramic plate comprises a multiphasic material, wherein the multiphasic material comprises an emissive phase and a second phase as describe above.

In some embodiments, the sintered ceramic plate may comprise two or more phosphor materials that transmit light at different peak wavelengths. In some embodiments, the two or more phosphor materials comprise a red light-emitting phosphor and a yellow-light emitting phosphor.

In other embodiments, the at least one sintered ceramic plate may comprise two or more stacked sintered ceramic plates, and each of the stacked sintered ceramic plates transmit light at different peak wavelengths. The emitted white light may have a CIE color chromaticity value of (0.33±0.15, 0.33±0.15). In one embodiment, the light emitting component is a blue light emitting LED and at least one of the sintered ceramic plates emits yellow light. The composition of the sintered plate has been described above.

Representative embodiments will now be described, including how such embodiments may be made. It is understood that the methods, materials, conditions, process parameters, apparatus and the like do not necessarily limit the scope of the invention.

Example 1

Preparation of Raw Particles by Using Inductively Coupled RF Thermal Plasma Pyrolysis 0.14923 mol (14.29 g) of Yttrium (III) nitrate hexahydrate (99.9% pure, Sigma-Aldrich), 0.25 mol (23.45 g) of Aluminum nitrate nonahydrate (99.97% pure, Sigma-Aldrich), and 0.015 mol (0.081 g) of Cerium (III) nitrate hexahydrate (99.99% pure, Sigma-Aldrich) were dissolved in 250 ml of deionized water, followed by ultrasonication for 30 min to prepare the transparent precursor solution. This precursor solution of 0.4 M was carried into a plasma reaction chamber via an atomization probe using a liquid pump.

All deposition experiments were conducted with an RF induction plasma torch (TEKNA Plasma System, Inc PL-35) operating at 3.3 MHz. For the deposition experiments, the chamber pressure was kept at around 25 kPa-35 kPa, and the RF generator plate power was in the range of 10-12 kW. Both the plate power and the deposition pressure are user-controlled parameters. Argon was introduced into the plasma torch as both the swirling sheath gas and the central plasma gas via the gas inlet ports. Sheath gas flow was maintained at 30 slm (standard liters per minute), while central gas flow was 10 slm.

Reactant injection was performed using a radial atomization probe (TEKNA Plasma System, Inc SDR-772). The probe was positioned at the center of the plasma plume during reactant injection. The reactants were fed into the plasma plume at a rate of 10 ml/min during deposition. Atomization of the liquid reactant was performed with Argon as atomizing gas delivered at a flow rate of 15 slm. The cooling water supply to the atomization probe was maintained at a flow rate of 4 slm and at a pressure of 1.2 MPa, as recommended by the manufacturer.

Crystalline phases of the deposited particles were investigated using X-ray diffraction (XRD) spectra obtained with a Bruker AXS micro-diffractometer (CuKα). The crystalline phase of the obtained sample was identified as a mixture of amorphous and yttrium aluminum perovskite (YAP). The average particle diameter ($D_{avg}$) was obtained from BET surface area based on data acquired from a Micrometritics model Gemini 2365 gas sorptometer. The obtained $D_{avg}$ of the sample was 75 nm.

Preparation of Sintered Ceramic Plates of Yag:Ce Phosphor Material

Sintered ceramic plates were made using YAG:Ce phosphor nano-powders. 4 g of nano-powder prepared by the method described above, 0.21 g of poly(vinyl butyral-co-vinyl alcohole-co-vinyl acetate) (average Mw 90,000-120,000 powder, Sigma-Aldrich), 0.012 g of fumed silica powder (CAB-O-SIL® HS-5, Cabot Corporation), and 10 ml of methanol were well mixed by mortar and pestle until the mixture slurry solution became very smooth. By blowing hot air form a dryer and keep the pestle moving, methanol was completely removed, and then dry powders were obtained. By varying the loading quantities as 45.0, 47.5, 50.0, and 52.5 mg, the obtained dry powders were spread out into die set with 3 mm of diameter (Product#: 0012-6646, 3 mm KBr Die Set, International Crystal Laboratories, Inc) followed by applying a pressure of 4000 psi using hydraulic press. Then the obtained plates were sintered at 1500° C. for 5 hrs (heating rate is 5° C./min) using box electrical furnace under an air ambient. Four sintered ceramic plate samples of YAG:Ce phosphor, which had yellow color, were prepared using this method. The crystalline phase of all ceramic plate samples was determined as yttrium aluminum garnet by XRD. The thicknesses of ceramic plates were measured by using conventional micrometer as summarized in Table 1.

Optical Measurement

Figure 15:
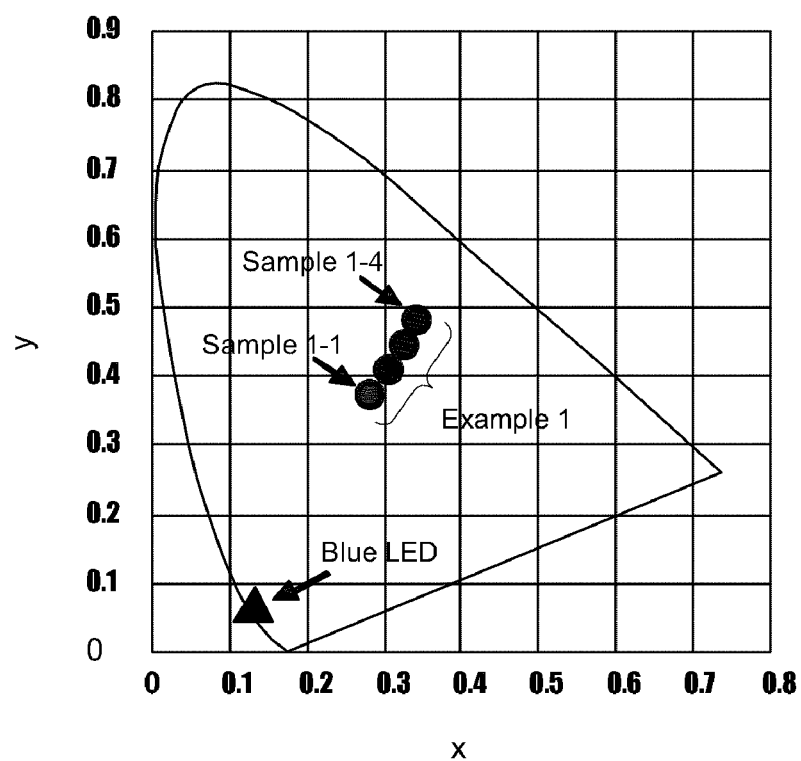
FIG. 15 shows CIE color chromaticity plots for three embodiments of the white LED with sintered YAG:Ce ceramic plates of different thicknesses.
Figure 16:
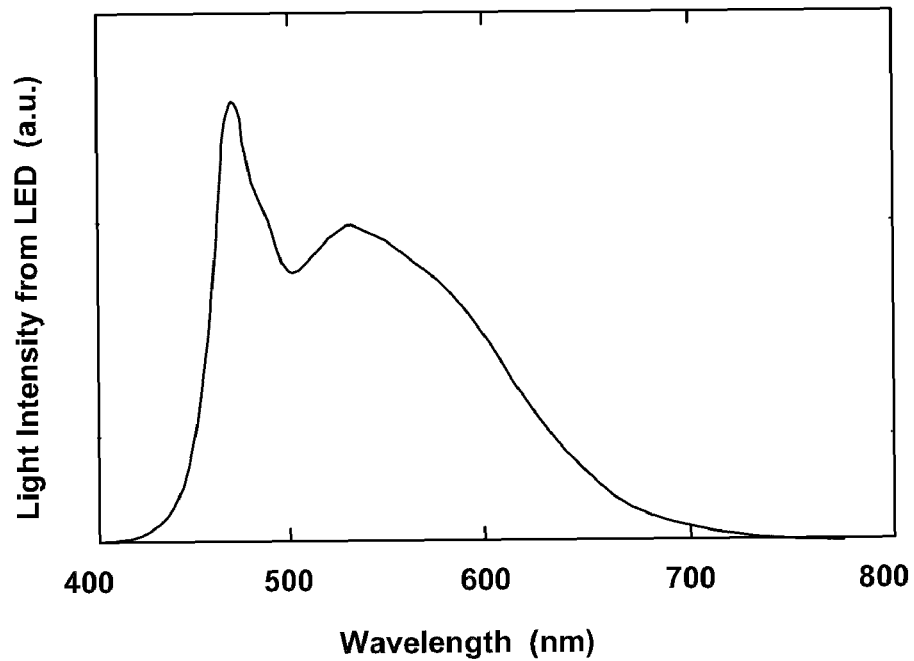
FIG. 16 is an emission spectrum of one embodiment of the white LED with sintered YAG:Ce ceramic plate.

These four ceramic plate samples were mounted onto a blue LED tip one by one under the operation condition of DC 10 mA at 2.9V. For each step, white light spectrum was acquired by using photo detector together with integrating sphere (MCPD 7000, Otsuka Electronics, Inc). In order to remove air gap between ceramics plate and LED tip, paraffin oil was filled into the gap. The identical LED tip and operation conditions were employed during these measurements. From these emission spectra, CIE color chromaticity (x, y) was calculated as summarized in Table 1 and as plotted in FIG. 15. A (x, y) value of blue LED is also plotted in FIG. 15. The color of the emitted light changed from bluish to yellowish as the thickness of ceramics plate increased. Among them, Sample 1-3 was proximate to emit white light and the emission spectrum was given in FIG. 16.

Figure 17:
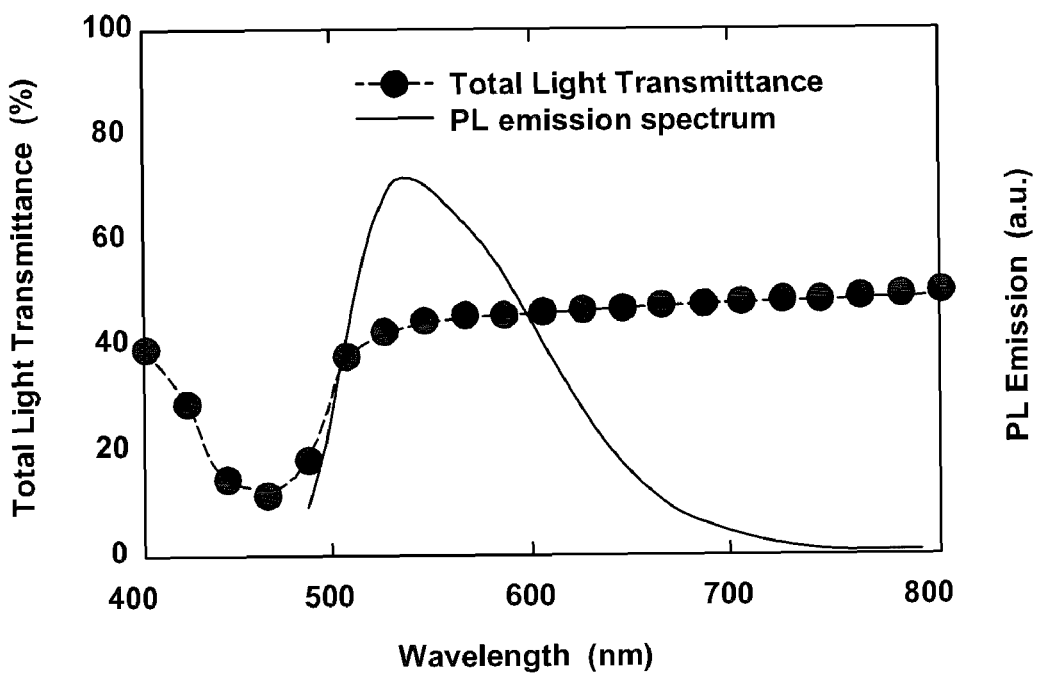
FIG. 17 shows the total light transmittance spectrum and photoluminescent spectrum of one embodiment of the ceramics plate.

In addition, total light transmittance data of Sample 1-3 were also measure by using the measurement system as shown in FIG. 4 (MCPD 7000, Otsuka Electronics, Inc, Xe lamp, monochromator, and integrating sphere equipped). Photoluminescent spectrum of the Sample 1-3 excited by a blue light (the peak wavelength was 460 nm) from monochromator was also acquired by using same photo detector. FIG. 17 shows the total light transmittance spectrum and photoluminescent spectrum of a ceramic plate (Sample 1-3). In FIG. 17, peak wavelength of the YAG:Ce ceramic plate was around 530 nm, and the total light transmittance at 530 nm was around 43%.

TABLE 1

| Sample No. | Sample 1-1 | Sample 1-2 | Sample 1-3 | Sample 1-4 |
| --- | --- | --- | --- | --- |
| Powder loading | 45.0 mg | 47.5 mg | 50.0 mg | 52.5 mg |
| Thickness of ceramics plate | 122 μm | 143 μm | 162 μm | 188 μm |
| CIE color chromaticity | (0.281, 0.375) | (0.303, 0.414) | (0.325, 0.449) | (0.339, 0.483) |

Example 2

Sintered ceramic plate samples were made using annealed nano-powders instead of as-synthesized nano-powders from RF plasma. The nano-powder prepared by previously mentioned RF plasma method was annealed at 1200° C. for 2 hrs in a $H_2/N_2$=3%/97% ambient using a quartz tube furnace (MTI Corporation GSL-1600X) at 1 atm. The rate of increase of temperature was 10° C./min. After the annealing, yellowish colored powder was obtained and yttrium aluminum garnet crystalline phase was determined by XRD. The average diameter after annealing obtained from BET measurement was 129 nm.

The same procedures for preparing the sintered ceramic plates described in Example 1 were followed. The loading quantities of dry powders spread out into die set with 3 mm of diameter were 45.0, 47.5, 50.0, 52.5, 55.0, and 57.5 mg. The crystalline phase of all ceramic plate samples was determined as yttrium aluminum garnet by XRD. The thicknesses of ceramics plates were summarized in Table 2.

In the same manners as described in Example 1, emission spectra from LED, CIE color chromaticity value, and total light transmittance were obtained. Among them, Sample 2-4 was proximate to emit white light. The peak wavelength of the YAG:Ce ceramic plate was around 530 nm, which is the same as Sample 1-3 in Example 1. Total light transmittance at 530 nm was around 61.5%.

TABLE 2

| Sample No. | Sample 2-1 | Sample 2-2 | Sample 2-3 | Sample 2-4 | Sample 2-5 | Sample 2-6 |
|---|---|---|---|---|---|---|
| Powder loading | 45.0 mg | 47.5 mg | 50.0 mg | 52.5 mg | 55.0 mg | 57.5 mg |
| Thickness of ceramics plate | 113 μm | 133 μm | 155 μm | 174 μm | 192 μm | 210 μm |
| CIE color chromaticity | (0.245, 0.291) | (0.274, 0.351) | (0.302, 0.403) | (0.322, 0.441) | (0.335, 0.462) | (0.348, 0.492) |

Comparative Example 1

Micron-sized YAG:Ce powder/silicone resin composite layer was prepare for comparison. 0.4 g of micron-sized YAG:Ce phosphor powder (P46-Y3, $D_{avg}$ 6.6 μm, Kasei Optonix, LTD.), and 0.6 g of silicone resin were mixed together. The mixture was cast onto a 0.55 mm-thick glass slide followed by curing the silicone resin at 150° C. for 1 hr using hot plate to obtain micron-sized YAG:Ce powder/silicone resin composite layer. The thickness of the composite layer on the glass slide was around 1 mm. The glass slide with composite layer was mounted onto the identical LED tip with the same operation condition as described in Example 1, so that the composite layer side is facing the LED tip. The air gap between the composite layer and the LED tip was filled by paraffin oil. Initially, the color of emitted light from the LED sample was yellowish because the composite layer was too thick to produce white color light. The thickness of the composite layer was filed down and adjusted by using sand paper until the emitted color became white. Finally, white color emission with CIE color chromaticity (x, y)=(0.322, 0.378) was obtained when the thickness of composite layer was 148 μm.

The peak wavelength of the YAG:Ce/silicone resin was around 550 nm, which is slightly red shifted compared to samples in Example 1. Total light transmittance at 550 nm was around 38.4%.

Comparative Example 2

Sintered ceramic plate was made using micron-sized YAG:Ce phosphor powders. Since the particle size was too large, a stable flat plate with thickness around 100 to 200 μm using die set could not be prepared. A portion of the broken plate was sintered under the same condition used in Example 1. The obtained broken ceramic plate presented yellow color, but it looked very diffusive like yellow paper. The thickness of the ceramic plate was roughly 150 μm, and the total light transmittance at 550 nm was around 23%. The ceramic plate was also mounted onto blue LED and emission spectrum was obtained. However, the emission color was almost yellow with (x, y) value of (0.383, 0.578) due to a strong scattering nature of the ceramic plate. The white color light was not obtained even when the thickness of ceramic plate was adjusted to less than 100 μm.

Comparative Example 3

The same samples in Example 1 were made, except the sintering was conducted at 1200° C. instead of 1500° C. Although flat plate was successfully prepared, the plate is quite opaque. Similar to Comparative Example 2, white color was not achieved even when the thickness of ceramic layer was less than 100 μm. The total light transmittance of the ceramic plate with the thickness of around 95 μm at 530 nm was around 27%, and obtained (x, y) value was (0.369, 0.545).

SUMMARY OF THE EXAMPLES AND COMPARATIVE EXAMPLES

Figure 18:
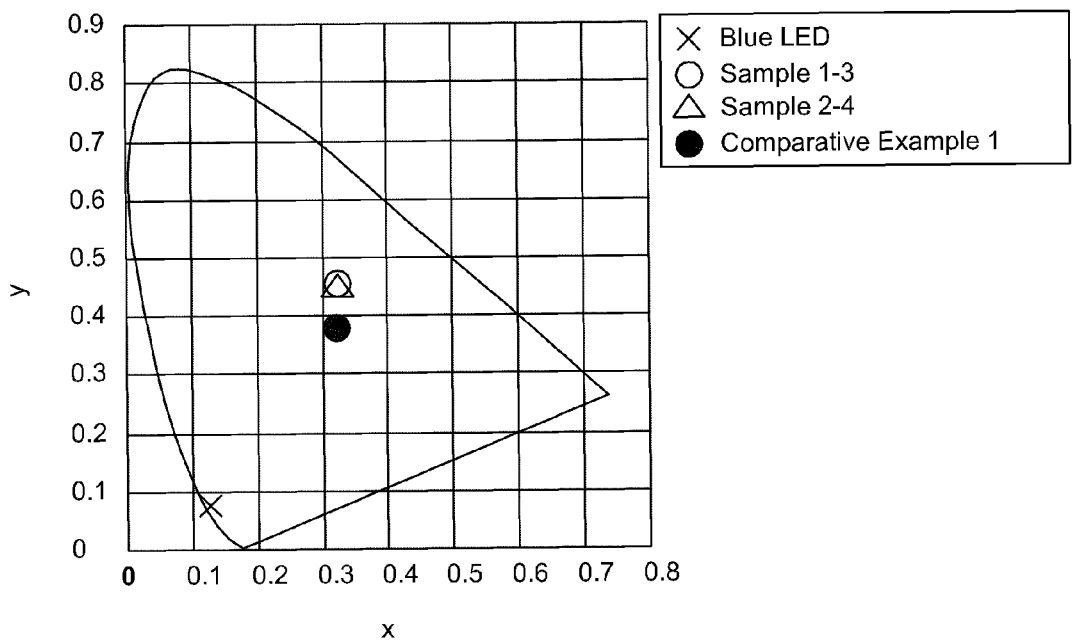
FIG. 18 shows CIE color chart of white color emission from LED samples made in accordance with disclosed embodiments and a comparative sample.

FIG. 18 shows CIE color chart of white color emission from LED samples when Sample 1-3, Sample 2-4, and Comparative Example 1 were mounted onto the blue LED. Focal characteristics were summarized in Table 3. The white color emission spectra of LED samples under the same operating condition were displayed in FIG. 19.

Figure 19:
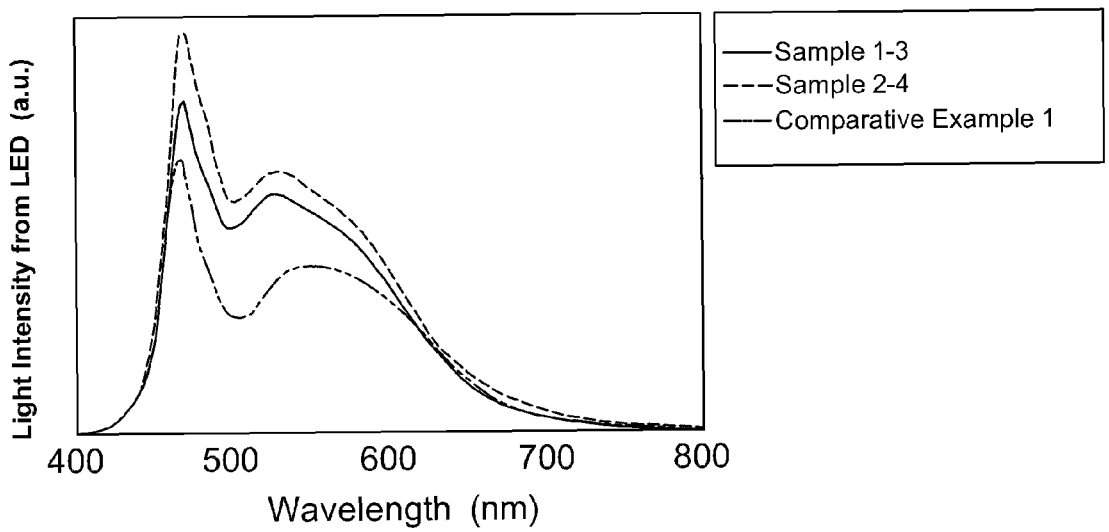
FIG. 19 shows the white light output from LED samples made in accordance with disclosed embodiments and a comparative sample.

As shown in FIG. 19, white light output from LED with ceramic plates made of nano-powders was much stronger than the conventional micro-sized phosphor powder/resin composite system.

Compared to the white light output between Sample 1-3 and Comparative Example 1, total light transmittance does not greatly differ, but remarkable difference was seen in terms of light output. This may be attributed to the superior crystallinity. In addition, Sample 2-4, which had greater total light transmittance than Sample 1-3, showed further improved light output possibly due to a reduced backscattering loss.

TABLE 3

| | Sample No. | | |
|---|---|---|---|
| | Sample 1-3 | Sample 2-4 | Comparative Example 1 |
| Thickness of ceramics plate | 162 μm | 174 μm | 148 μm (Composite) |
| Total light transmittance | 43% (530 nm) | 61.5% (530 nm) | 38.4% (550 nm) |
| CIE color chromaticity | (0.325, 0.449) | (0.322, 0.441) | (0.322, 0.378) |

Example 3

Multiphasic sintered ceramic plate: sample 3-1 was made using the RF plasma method described in Example 1. The precursor solution was prepared by dissolving 0.14923 mol (14.29 g) of Yttrium (III) nitrate hexahydrate (99.9% pure, Sigma-Aldrich), 0.25625 mol (24.03 g) of Aluminum nitrate nonahydrate (99.97% pure, Sigma-Aldrich), and 0.015 mol (0.081 g) of Cerium (III) nitrate hexahydrate (99.99% pure, Sigma-Aldrich) in 250 ml of deionized water, followed by ultrasonication for 30 min. The nano-powders prepared using this precursor solution have additional material $Al_2O_3$ for forming the second phase. The nano-powders were annealed at 1200° C. for 2 hrs in a $H_2/N_2=3\%/97\%$ ambient. The rate of the increase of temperature was 5° C./min. After the annealing, yellowish colored powder was obtained and yttrium aluminum garnet crystalline phase was determined by XRD. Small XRD peaks of $Al_2O_3$ phase were also detected in accordance with the amount of second phase material in the Al-rich composition.

The same procedure for preparing the sintered ceramic plates described in Example 1 was followed. Additional samples having different amount of $Al_2O_3$ were prepare by varying Y/Al ratio as summarized in Table 4. The loading quantities of dry powders spread out into die set with 3 mm of diameter were 100.0 mg. The pressed ceramic compact samples were sintered at different temperatures (1600° C. and 1700° C.) in vacuum. The thicknesses of ceramics plates and total light transmittance are also summarized in Table 4.

Figure 20:
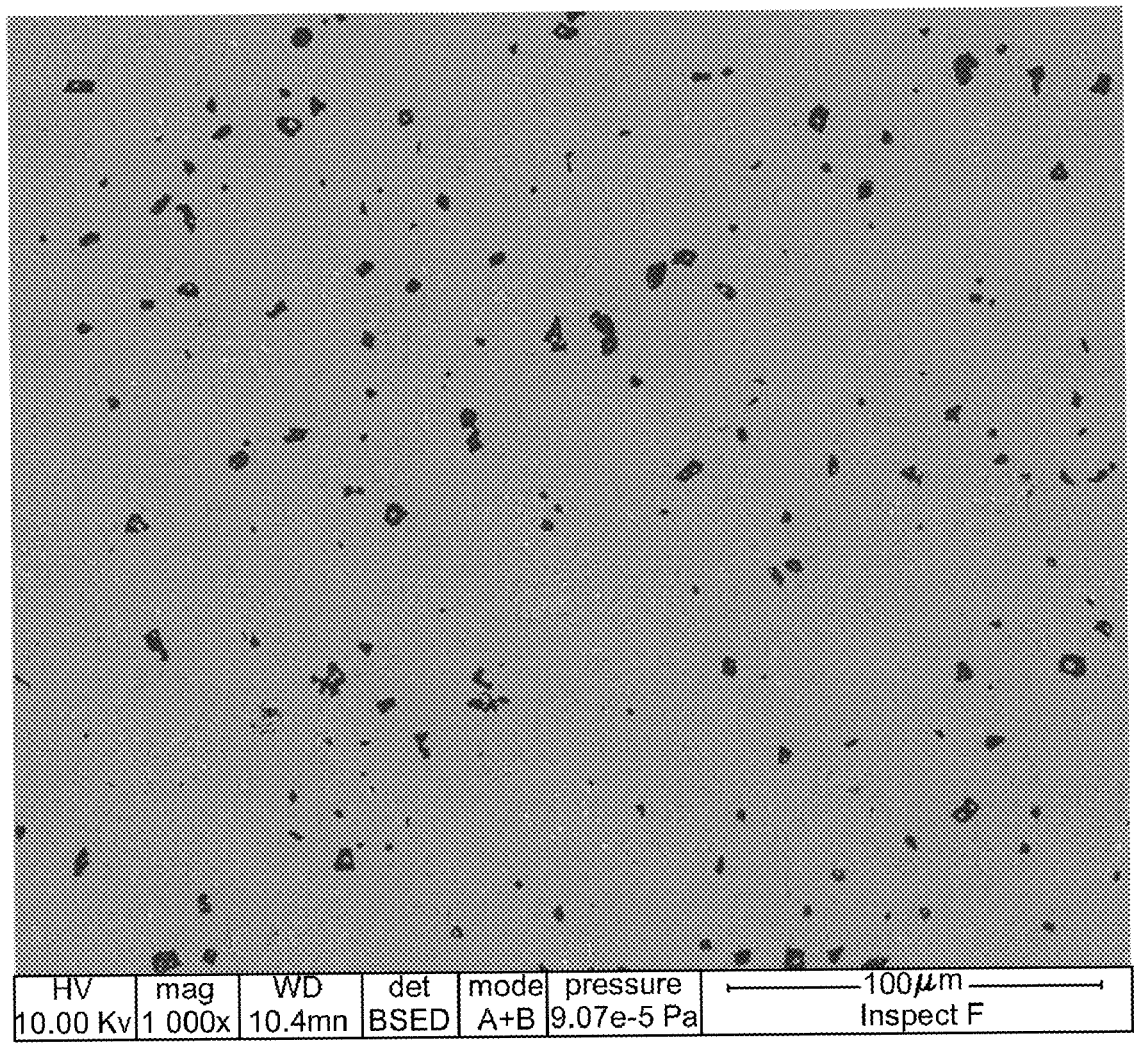
FIG. 20 shows a scanning electron microscope (SEM) image of a ceramic plate made in accordance with disclosed embodiments.

Scanning electron microscope (SEM) on an FEI Company Scanning Electron Microscope (Hillsboro, Ore, USA) model Inspect F were taken at an acceleration voltage of 10,000 kv, at 5000× magnification, a work distance of 10.5 mm, using a BSED detector, selected mode A+B; and vacuum pressure at 9.07 e-5 Pa. The sample surface for SEM observation was carefully polished. Crystalline grain structure with different contrast was observed by the SEM, and brighter contrast crystalline grain was determined as YAG crystalline phase while darker one was determined as alumina phase by using elemental analysis. By using image processing technique, percentage of alumina phase occupied in YAG phase was calculated numerically and summarized in Table 4. A SEM image of Sample 3-3 is shown in FIG. 20. The calculated alumina second phase is about 3%.

TABLE 4

| Sample | Y/Al ratio | Annealing temperature | % Total Transmittance | Thickness | Percentage of $Al_2O_3$ grain area in YAG |
|---|---|---|---|---|---|
| Sample 3-1 | 3.000/5.125 | 1600° C. | 72% | 265 um | 1.2% |
| Sample 3-2 | 3.000/5.125 | 1700° C. | 75% | 263 um | 0.9% |
| Sample 3-3 | 3.000/5.375 | 1600° C. | 67% | 271 um | 2.6% |
| Sample 3-4 | 3.000/5.375 | 1700° C. | 69% | 265 um | 2.4% |
| Sample 3-5 | 3.000/6.125 | 1600° C. | 49% | 281 um | 9.2% |
| Sample 3-6 | 3.000/6.125 | 1700° C. | 55% | 276 um | 11.4% |
| Comparative Sample 3-1 | 3.000/7.250 | 1600° C. | 37% | 276 um | 19.8% |
| Comparative Sample 3-2 | 3.000/10.000 | 1600° C. | 32% | 276 um | 34.7% |

The results demonstrate that lower levels of $Al_2O_3$ provide greater levels of transmittance as compared to higher levels of $Al_2O_3$ (as in Comparative Samples 3-1 and 3-2).

What is claimed is:

1. A light emitting device comprising:
   a light emitting component that emits light with a first peak wavelength of about 440 nm to about 470 nm;
   at least one sintered ceramic plate over the light emitting component, wherein the at least one sintered ceramic plate comprises a multiphasic material, said multiphasic material comprises about 95% to about 99.5% by volume of an emissive phase and about 5% to about 0.5% by volume of a second phase; and
   wherein the at least one sintered ceramic plate is capable of absorbing at least a portion of the light emitted from said light emitting component and emitting light of a second peak wavelength, and has a total light transmittance at the second peak wavelength of greater than about 40%.

2. The light emitting device of claim 1, wherein the multiphasic material comprises about 98% to about 99.5% by volume of the emissive phase and about 2% to about 0.5% by volume of the second phase.

3. The light emitting device of claim 1, wherein said at least one sintered ceramic plate is prepared by using nano-sized raw ceramic powders having an average particle size of less than 1000 nm.

4. The light emitting device of claim 1, wherein said at least one sintered ceramic plate further comprises about 0.05% to about 5% by weight of a sintering aid.

5. The light emitting device of claim 4, wherein said sintering aid is selected from the group consisting of MgO, $SiO_2$ and tetraethyl orthosilicate.

6. The light emitting device of claim 1, wherein the emissive phase comprises a phosphor material.

7. The light emitting device of claim 6, wherein the phosphor material comprises a garnet represented by the formula $A_3B_5O_{12}$, wherein A and B are trivalent metals, and wherein A is selected from Y, Gd, La, and Tb, and B is selected from Al, Ga, and In.

8. The light emitting device of claim 7, wherein said garnet is doped with at least one rare earth metal.

9. The light emitting device of claim 8, wherein said rare earth metal is selected from Ce, Gd, La, Tb, Pr and Eu.

10. The light emitting device of claim 6, wherein said phosphor material comprises $Y_3Al_5O_{12}:Ce^{3+}$.

11. The light emitting device of claim 1, wherein said second phase comprises a material selected from the group consisting of $Y_2O_3$, $Al_2O_3$, YAP, and YAM.

12. The light emitting device of claim 1, wherein said second phase is $Al_2O_3$ or $Y_2O_3$.

13. The light emitting device of claim 1, wherein said second phase forms a plurality of particles dispersed within the emissive phase.

14. The light emitting device of claim 1, wherein said emissive phase comprises $Y_3Al_5O_{12}:Ce^{3+}$ and said second phase comprises $Al_2O_3$.

15. A method for improving the luminance intensity of a light emitting device comprising:
    providing a light emitting component; and
    positioning at least one sintered ceramic plate comprising a multiphasic material over the light emitting component, said multiphasic material comprises about 95% to about 99.5% by volume of an emissive phase and about 5% to about 0.5% by volume of a second phase, wherein the at least one sintered ceramic plate has a transmittance of at least about 40% at the peak transmission wavelength, thereby emitting white light from said light emitting device.

16. The method of claim 15, wherein the multiphasic material comprises about 98% to about 99.5% by volume of the emissive phase, and about 2% to about 0.5% by volume of the second phase.

17. The method of claim 15, wherein said at least one sintered ceramic plate is prepared by using nano-sized raw ceramic powders having an average particle size of less than 1000 nm.

18. The method of claim 15, wherein said at least one sintered ceramic plate further comprises about 0.05% to about 5% by weight of a sintering aid.

19. The method of claim 18, wherein said sintering aid is selected from the group consisting of MgO, $SiO_2$ and tetraethyl orthosilicate.

20. The method of claim 15, wherein the emissive phase comprises a phosphor material.

21. The method of claim 20, wherein the phosphor material comprises a garnet represented by the formula $A_3B_5O_{12}$, wherein A and B are trivalent metals, and wherein A is selected from Y, Gd, La, and Tb, and B is selected from Al, Ga, and In.

22. The method of claim 21, wherein said garnet is doped with at least one rare earth metal.

23. The method of claim 22, wherein said rare earth metal is selected from Ce, Gd, La, Tb, Pr and Eu.

24. The method of claim 20, wherein said phosphor material comprises $Y_3Al_5O_{12}:Ce^{3+}$.

25. The method of claim 15, wherein said second phase comprises a material selected from the group consisting of $Y_2O_3$, $Al_2O_3$, YAP, and YAM.

26. The method of claim 15, wherein said second phase is $Al_2O_3$ or $Y_2O_3$.

* * * * *